US008411074B2

(12) United States Patent
Liu et al.

(10) Patent No.: US 8,411,074 B2
(45) Date of Patent: Apr. 2, 2013

(54) GATE DRIVING CIRCUIT HAVING A SHIFT REGISTER STAGE CAPABLE OF PULLING DOWN GATE SIGNALS OF A PLURALITY OF SHIFT REGISTER STAGES

(75) Inventors: Sheng-Chao Liu, Hsin-Chu (TW); Kuang-Hsiang Liu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 955 days.

(21) Appl. No.: 12/488,581

(22) Filed: Jun. 21, 2009

(65) Prior Publication Data

US 2010/0238143 A1 Sep. 23, 2010

(30) Foreign Application Priority Data

Mar. 17, 2009 (TW) ................................ 98108669 A

(51) Int. Cl.
*G06F 3/038* (2006.01)
*G09G 3/36* (2006.01)
*G11C 19/00* (2006.01)

(52) U.S. Cl. ........................... 345/204; 345/100; 377/64

(58) Field of Classification Search ........................ None
See application file for complete search history.

(56) References Cited

U.S. PATENT DOCUMENTS

| | | | | |
|---|---|---|---|---|
| 7,342,568 | B2 | 3/2008 | Wei et al. | |
| 2007/0217563 | A1 | 9/2007 | Chang et al. | |
| 2009/0128541 | A1 * | 5/2009 | Tsai et al. | 345/213 |

* cited by examiner

*Primary Examiner* — Alexander S Beck
*Assistant Examiner* — Kirk Hermann
(74) *Attorney, Agent, or Firm* — Winston Hsu; Scott Margo

(57) ABSTRACT

A high-reliability gate driving circuit includes a plurality of odd shift register stages and a plurality of even shift register stages. Each odd shift register stage generates a corresponding gate signal furnished to a corresponding odd gate line according to a first clock and a second clock having a phase opposite to the first clock, and further functions to pull down a gate signal of at least one even gate line or at least one odd gate line different from the corresponding odd gate line. Each even shift register stage generates a corresponding gate signal furnished to a corresponding even gate line according to a third clock and a fourth clock having a phase opposite to the third clock, and further functions to pull down a gate signal of at least one odd gate line or at least one even gate line different from the corresponding even gate line.

26 Claims, 9 Drawing Sheets

GATE DRIVING CIRCUIT HAVING A SHIFT REGISTER STAGE CAPABLE OF PULLING DOWN GATE SIGNALS OF A PLURALITY OF SHIFT REGISTER STAGES

BACKGROUND OF THE INVENTION

1. Field of the Invention

The present invention relates to a gate driving circuit, and more particularly, to a high-reliability gate driving circuit having alternating and auxiliary pull-down mechanisms.

2. Description of the Prior Art

Because the liquid crystal display (LCD) has advantages of thin appearance, low power consumption, and low radiation, the liquid crystal display has been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of the light source provided by a backlight module.

In general, the liquid crystal display comprises a plurality of pixel units, a gate driving circuit, and a source driving circuit. The source driving circuit is utilized for providing a plurality of data signals to be written into the pixel units. The gate driving circuit comprises a plurality of shift register stages and functions to provide a plurality of gate driving signals for controlling the operations of writing the data signals into the pixel units. That is, the gate driving circuit is a crucial device for providing a control of writing the data signals into the pixel units.

FIG. 1 is a schematic diagram showing a prior-art gate driving circuit. As shown in FIG. 1, the gate driving circuit 100 comprises a first shift register module 105 and a second shift register module 106. The first shift register module 105 includes a plurality of odd shift register stages and the second shift register module 106 includes a plurality of even shift register stages. For ease of explanation, the first shift register module 105 illustrates only an Nth shift register stage 181 and an (N+2)th shift register stage 183; and the second shift register module 106 illustrates only an (N+1)th shift register stage 182 and an (N+3)th shift register stage 184. The number N is a positive odd integer. The odd shift register stages are employed to generate a plurality of gate signals furnished to the odd gate lines of a pixel array 101 according to a first clock CK1 and a second clock CK2 having a phase opposite to the first clock CK1. The even shift register stages are employed to generate a plurality of gate signals furnished to the even gate lines of the pixel array 101 according to a third clock CK3 and a fourth clock CK4 having a phase opposite to the third clock CK3.

For instance, the Nth shift register stage 181 is put in use for generating a gate signal SGn based on the first clock CK1 and the second clock CK2. The gate signal SGn is then furnished to an odd gate line GLn of the pixel array 101 for providing a control of writing the data signal delivered by a data line DLi into a corresponding pixel unit 103. However, in the operation of the gate driving circuit 100, except for the interval during which the Nth shift register stage 181 is activated for generating the gate signal SGn having high voltage level, the gate signal SGn of the gate line GLn is required to be pulled down to low voltage level. That is, the gate signal SGn is held at low voltage level in most of operating time. According to the architecture of the gate driving circuit 100, the circuit operation for pulling down the gate signal SGn of the gate line GLn is carried out only through the pull-down unit 191 of the Nth shift register stage 181. For that reason, if the channel lengths of transistors therein are devised to be substantially fixed, the channel width of a transistor 192 used in the pull-down unit 191 is demanded to be wide enough for efficiently pulling down the gate signal SGn of the Gate line GLn. Nevertheless, as the channel width of the transistor 192 is wider, it is likely to incur an occurrence of greater threshold voltage drift and degrade the reliability and lifetime of the gate driving circuit 100.

SUMMARY OF THE INVENTION

In accordance with an embodiment of the present invention, a high-reliability gate driving circuit for providing a plurality of gate signals to drive a pixel array having a plurality of gate lines is disclosed. The gate driving circuit comprises a first shift register module and a second shift register module. The first shift register module comprises a plurality of odd shift register stages. Each of the odd shift register stages provides a corresponding odd gate line of the gate lines with a corresponding gate signal of the gate signals according to a first clock and a second clock having a phase opposite to the first clock. The odd shift register stage is further employed to pull down at least one gate signal delivered by at least one even gate line of the gate lines or at least one odd gate line different from the corresponding odd gate line. The second shift register module comprises a plurality of even shift register stages. Each of the even shift register stages provides a corresponding even gate line of the gate lines with a corresponding gate signal of the gate signals according to a third clock and a fourth clock having a phase opposite to the third clock. The even shift register stage is further employed to pull down at least one gate signal delivered by at least one odd gate line of the gate lines or at least one even gate line different from the corresponding even gate line.

In accordance with another embodiment of the present invention, a high-reliability gate driving circuit for providing a plurality of gate signals to a plurality of gate lines is disclosed. The gate driving circuit comprises a plurality of shift register stages. An Nth shift register stage of the shift register stages comprises a pull-up unit, an input unit, an energy-store unit, a discharging unit, a pull-down module, and a control unit. The pull-up unit is electrically connected to an Nth gate line of the gate lines and functions to pull up an Nth gate signal of the gate signals to a high level voltage according to a driving control voltage and a first clock. The Nth gate line is employed to deliver the Nth gate signal. The input unit is employed to receiving an Mth gate signal generated by an Mth shift register stage of the shift register stages. The energy-store unit, electrically connected to the pull-up unit and the input unit, is utilized for providing the driving control voltage to the pull-up unit through performing a charging process based on the Mth gate signal. The discharging unit is electrically connected to the energy-store unit for pulling down the driving control voltage to a low power voltage according to a control signal. The pull-down module is used to pull down the Nth gate signal to the low power voltage according to the control signal and a second clock having a phase opposite to the first clock. The pull-down module is further employed to pull down at least one gate signal different from the Nth gate signal to the low power voltage. The control unit, electrically connected to the energy-store unit, the discharging unit and the pull-down module, is utilized for generating the control signal according to the driving control voltage and the first clock. The numbers M and N are positive integers and N is greater than M.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
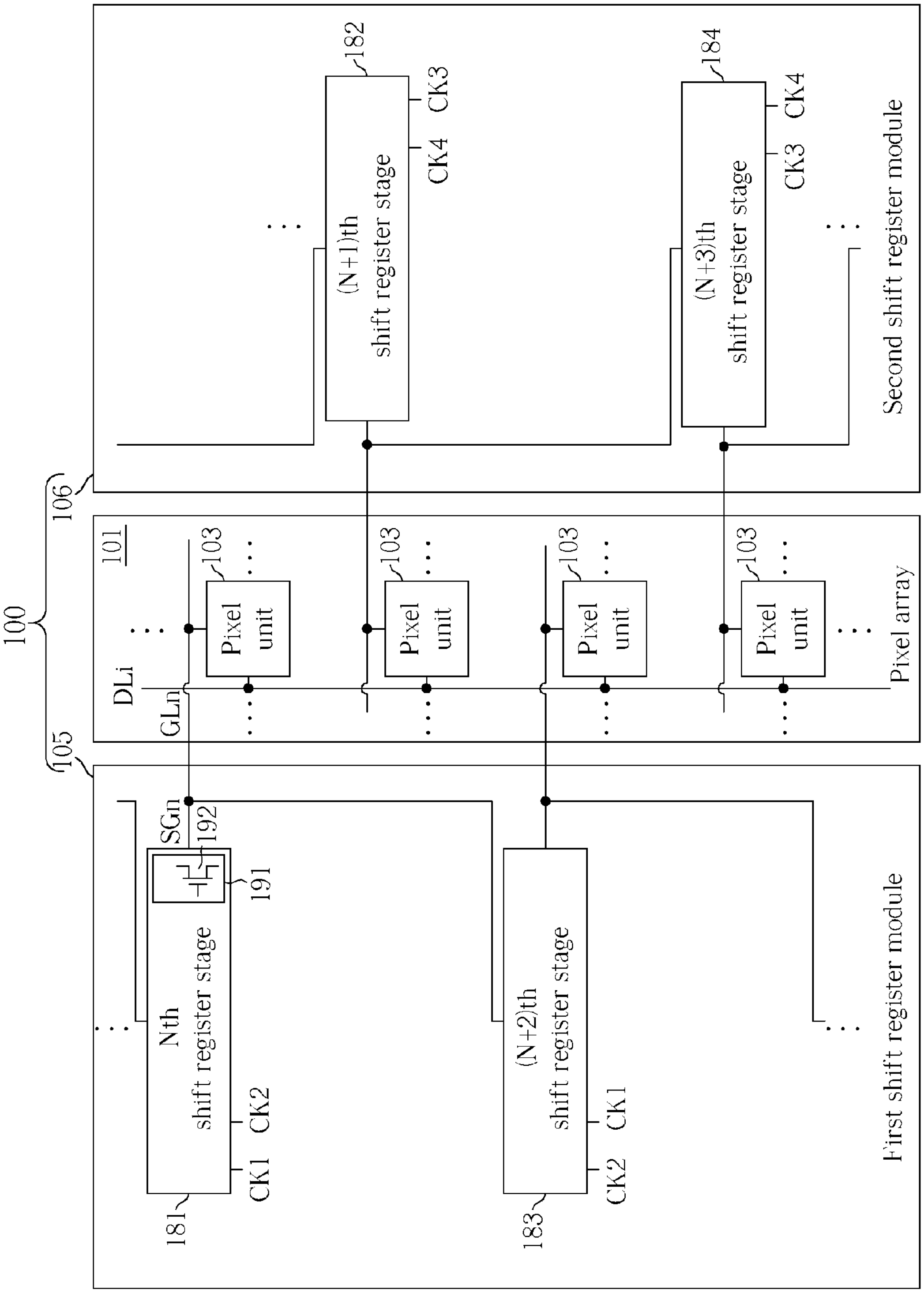
FIG. 1 PRIOR ART
FIG. 1 is a schematic diagram showing a prior-art gate driving circuit.
Figure 2:
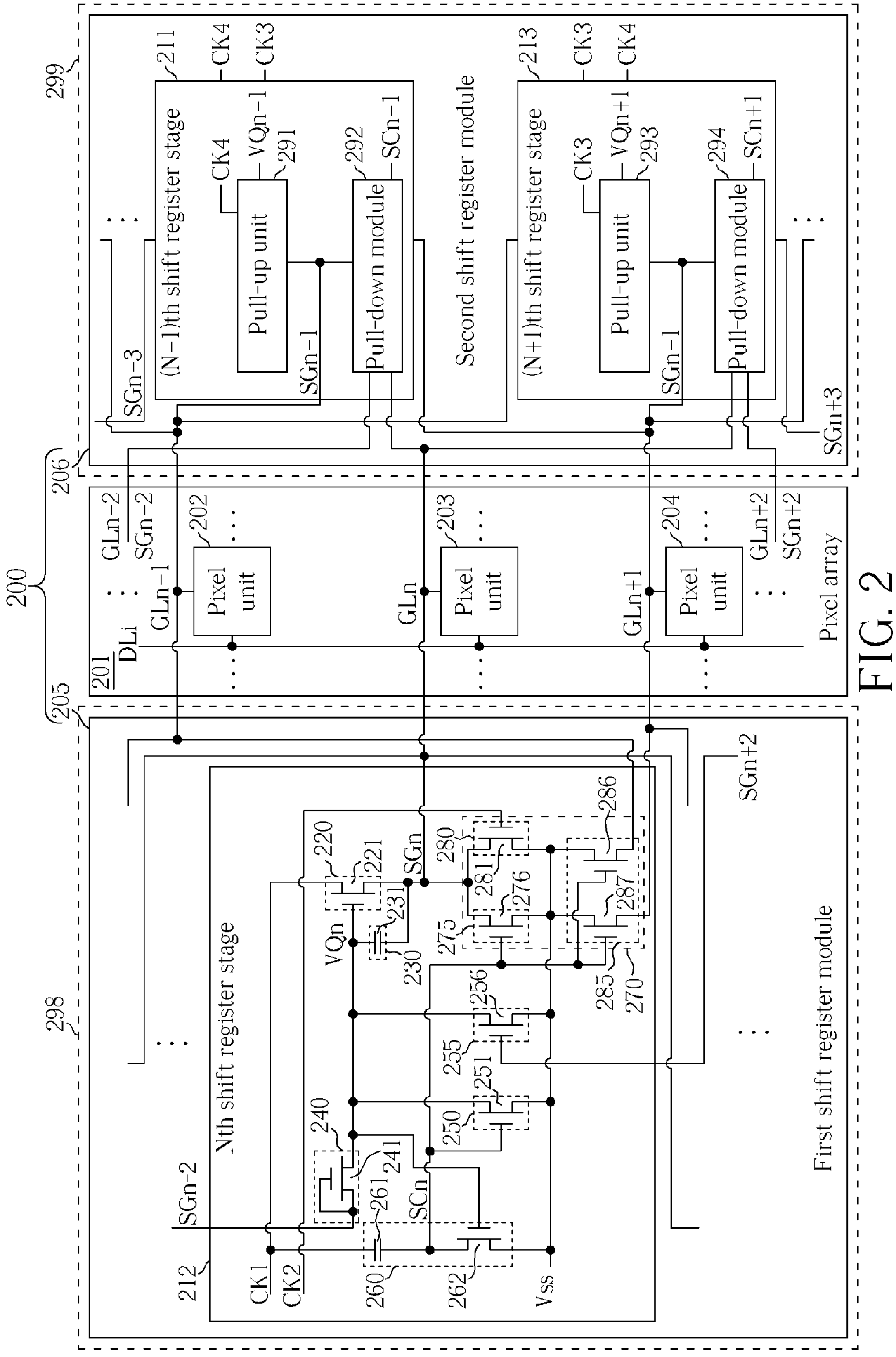
FIG. 2 is a schematic diagram showing a gate driving circuit in accordance with a first embodiment of the present invention.

FIG. 2 is a schematic diagram showing a gate driving circuit in accordance with a first embodiment of the present invention. As shown in FIG. 2, the gate driving circuit 200 comprises a first shift register module 205 and a second shift register module 206. The first shift register module 205 is disposed in a first border area 298 adjacent to a pixel array 201. The second shift register module 206 is disposed in a second border area 299 adjacent to the pixel array 201. The first border area 298 and the second border area 299 are substantially surrounding the pixel array 201 and positioned opposite to each other. In another embodiment, the first shift register module 205 and the second shift register module 206 can be disposed in the same border area, e.g. both in the first border area 298 or the second border area 299. The first shift register module 205 includes a plurality of odd shift register stages and the second shift register module 206 includes a plurality of even shift register stages. For ease of explanation, the first shift register module 205 illustrates only an Nth shift register stage 212; the second shift register module 206 illustrates only an (N−1)th shift register stage 211 and an (N+1)th shift register stage 213; and only the internal structure of the Nth shift register stage 212 is exemplified in detail. The number N is a positive odd integer.

The Nth shift register stage 212 is employed to generate a gate signal SGn according to a first clock CK1 and a second clock CK2 having a phase opposite to the first clock CK1. The gate signal SGn is furnished to an odd gate line GLn of the pixel array 201 for providing a control of writing the data signal delivered by a data line DLi into a pixel unit 203. The Nth shift register stage 212 is further used to assist in pulling down the gate signals SGn−1, SGn+1 of even gate lines GLn−1, GLn+1. The (N−1)th shift register stage 211 is employed to generate a gate signal SGn−1 according to a third clock CK3 and a fourth clock CK4 having a phase opposite to the third clock CK3. The gate signal SGn−1 is furnished to an even gate line GLn−1 of the pixel array 201 for providing a control of writing the data signal delivered by the data line DLi into a pixel unit 202. The (N−1)th shift register stage 211 is further used to assist in pulling down the gate signals SGn, SGn−2 of odd gate lines GLn, GLn−2. The (N+1)th shift register stage 213 is employed to generate a gate signal SGn+1 according to the third clock CK3 and the fourth clock CK4. The gate signal SGn+1 is furnished to an even gate line GLn+1 of the pixel array 201 for providing a control of writing the data signal delivered by the data line DLi into a pixel unit 204. The (N+1)th shift register stage 213 is further used to assist in pulling down the gate signals SGn, SGn+2 of odd gate lines GLn, GLn+2.

The Nth shift register stage 212 comprises a pull-up unit 220, an input unit 240, an energy-store unit 230, a first discharging unit 250, a second discharging unit 255, a pull-down module 270, and a control unit 260. The pull-up unit 220, electrically connected to the gate line GLn, is utilized for pulling up the gate signal SGn of the gate line GLn according to a driving control voltage VQn and the first clock CK1. The input unit 240 is electrically connected to an (N−2)th shift register stage (not shown) for receiving the gate signal SGn−2. That is, the gate signal SGn−2 is not only furnished to the pixel array 201 but also forwarded to the Nth shift register stage 212 and functions as a start pulse signal for activating the Nth shift register stage 212. The energy-store unit 230, electrically connected to the pull-up unit 220 and the input unit 240, is put in use for providing the driving control voltage VQn to the pull-up unit 220 by performing a charging process based on the gate signal SGn−2. The control unit 260, electrically connected to the first discharging unit 250 and the pull-down module 270, is employed to generate a control signal SCn according to the first clock CK1 and the driving control voltage VQn. The first discharging unit 250 is electrically connected to the energy-store unit 230 for pulling down the driving control voltage VQn to a low power voltage Vss through performing a discharging process under control by the control signal SCn. The second discharging unit 255 is electrically connected to the energy-store unit 230 for pulling down the driving control voltage VQn to the low power voltage Vss through performing a discharging process under control by the gate signal SGn+2 provided by an (N+2)th shift register stage (not shown).

The pull-down module 270, electrically connected to the gate line GLn and the control unit 260, is employed to pull down the gate signal SGn to the low power voltage Vss according to the control signal SCn and the second clock CK2. The pull-down module 270 is further used to pull down the gate signals SGn−1, SGn+1 of the even gate lines GLn−1, GLn+1 to the low power voltage Vss according to the control signal SCn. The pull-down module 270 includes a first pull-down unit 275, a second pull-down unit 280, and an auxiliary pull-down unit 285. The first pull-down unit 275 functions to pull down the gate signal SGn to the low power voltage Vss based on the control signal SCn. The second pull-down unit 280 functions to pull down the gate signal SGn to the low power voltage Vss based on the second clock CK2. The auxiliary pull-down unit 285 functions to pull down the gate signals SGn−1, SGn+1 to the low power voltage Vss based on the control signal SCn.

In the first embodiment shown in FIG. 2, the pull-up unit 220 comprises a first transistor 221, the input unit 240 comprises a second transistor 241, the energy-store unit 230 comprises a first capacitor 231, the first discharging unit 250 comprises a third transistor 251, the second discharging unit 255 comprises a fourth transistor 256, the control unit 260 comprises a fifth transistor 262 and a second capacitor 261, the first pull-down unit 275 comprises a sixth transistor 276, the second pull-down unit 280 comprises a seventh transistor 281, and the auxiliary pull-down unit 285 comprises an eighth transistor 286 and a ninth transistor 287. The second transistor 241 comprises a first end for receiving the gate signal SGn−2, a second end electrically connected to the first capacitor 231, and a gate end electrically connected to the first end. The circuit functionality of the second transistor 241 is actually similar to a diode. Accordingly, the first and second ends of the second transistor 241 are corresponding respectively to the anode and cathode of a diode. In view of that, the second transistor 241 is turned on by the gate signal SGn−2 having high voltage level for passing the gate signal SGn−2 to the second end thereof; alternatively, the second transistor 241 is turned off by the gate signal SGn−2 having low voltage level.

The first transistor 221 comprises a first end for receiving the first clock CK1, a second end electrically connected to the gate line GLn, and a gate end electrically connected to the second end of the second transistor 241. The first capacitor 231 comprises a first end electrically connected to the gate end of the first transistor 221 and a second end electrically connected to the second end of the first transistor 221. The third transistor 251 comprises a first end electrically connected to the first end of the first capacitor 231, a second end for receiving the low power voltage Vss, and a gate end electrically connected to the control unit 260 for receiving the control signal SCn. The fourth transistor 256 comprises a first end electrically connected to the first end of the first capacitor 231, a second end for receiving the low power voltage Vss, and a gate end for receiving the gate signal SGn+2. The second capacitor 261 comprises a first end for receiving the first clock CK1 and a second end electrically connected to the gate end of the third transistor 251. The fifth transistor 262 comprises a first end electrically connected to the second end of the second capacitor 261, a second end for receiving the low power voltage Vss, and a gate end electrically connected to the first end of the first capacitor 231.

The sixth transistor 276 comprises a first end electrically connected to the gate line GLn, a second end for receiving the low power voltage Vss, and a gate end electrically connected to the first end of the fifth transistor 262 for receiving the control signal SCn. The seventh transistor 281 comprises a first end electrically connected to the gate line GLn, a second end for receiving the low power voltage Vss, and a gate end for receiving the second clock CK2. The eighth transistor 286 comprises a first end electrically connected to the gate line GLn−1, a second end for receiving the low power voltage Vss, and a gate end electrically connected to the first end of the fifth transistor 262 for receiving the control signal SCn. The ninth transistor 287 comprises a first end electrically connected to the gate line GLn+1, a second end for receiving the low power voltage Vss, and a gate end electrically connected to the first end of the fifth transistor 262 for receiving the control signal SCn. The first transistor 221 through the ninth transistor 287 are thin film transistors, metal oxide semiconductor field effect transistors, or junction field effect transistors.

With this structure in mind, it is obvious that the eighth transistor 286 is utilized for providing an auxiliary pull-down mechanism to assist the pull-down module 292 of the (N−1)th shift register stage 211 in pulling down the gate signal SGn−1; and the ninth transistor 287 is utilized for providing an auxiliary pull-down mechanism to assist the pull-down module 294 of the (N+1)th shift register stage 213 in pulling down the gate signal SGn+1. Similarly, the pull-down module 292 and the pull-down module 294 can be utilized for providing auxiliary pull-down mechanisms to assist the pull-down module 270 of the Nth shift register stage 212 in pulling down the gate signal SGn. In other words, the gate signal SGn is pulled down to the low power voltage Vss with the aid of multiple pull-down modules 270, 292 and 294 in the operation of the gate driving circuit 200. For that reason, if the channel lengths of transistors therein are devised to be substantially fixed, the channel widths of the sixth transistor 276, the seventh transistor 281, the eighth transistor 286 and the ninth transistor 287 in the pull-down module 270 can be reduced significantly while retaining desired pull-down efficiency. Therefore, the threshold voltage drifts regarding the transistors used in the pull-down module 270 can be lessened significantly for enhancing the reliability and lifetime of the gate driving circuit 200. The detailed internal structures of other shift register stages in the gate driving circuit 200, e.g. the (N−1)th shift register stage 211 and the (N+1)th shift register stage 213, are similar to that of the Nth shift register stage 212 and can be inferred by analogy. It is noted that the pull-up unit 291 of the (N−1)th shift register stage 211 pulls up the gate signal SGn−1 based on the driving control voltage VQn−1 and the fourth clock CK4 while the pull-up unit 293 of the (N+1)th shift register stage 213 pulls up the gate signal SGn+1 based on the driving control voltage VQn+1 and the third clock CK3.

Figure 3:
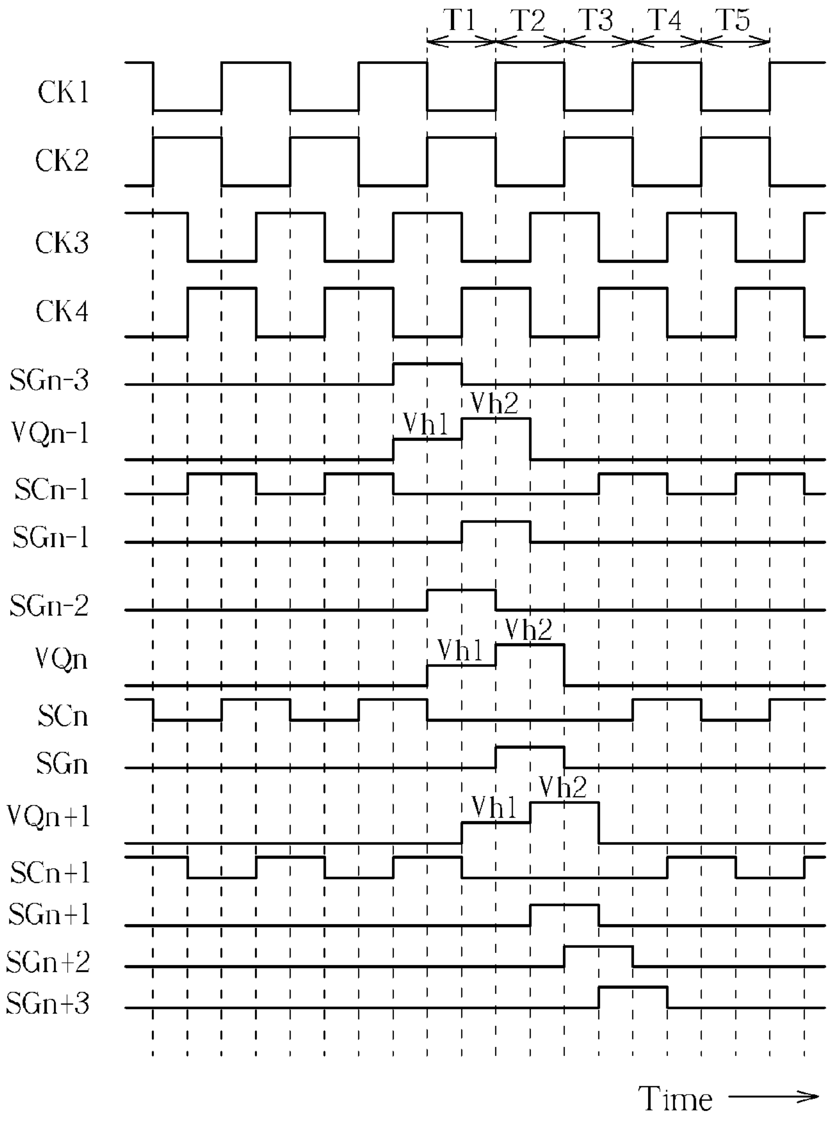
FIG. 3 is a schematic diagram showing related signal waveforms regarding the operation of the gate driving circuit in FIG. 2, having time along the abscissa.

FIG. 3 is a schematic diagram showing related signal waveforms regarding the operation of the gate driving circuit in FIG. 2, having time along the abscissa. The signal waveforms in FIG. 3, from top to bottom, are the first clock CK1, the second clock CK2, the third clock CK3, the fourth clock CK4, the gate signal SGn−3, the driving control voltage VQn−1, the control signal SCn−1, the gate signal SGn−1, the gate signal SGn−2, the driving control voltage VQn, the control signal SCn, the gate signal SGn, the driving control voltage VQn+1, the control signal SCn+1, the gate signal SGn+1, the gate signal SGn+2, and the gate signal SGn+3. The third clock CK3 has a phase shift of 90 degrees relative to the first clock CK1.

As shown in FIG. 3, during an interval T1, the gate signal SGn−2 is shifting from low voltage level to high voltage level, the second transistor 241 is then turned on for charging the capacitor 231 so as to boost the driving control voltage VQn to a first high voltage Vh1. In the Meantime, the fifth transistor 262 is turned on by the driving control voltage VQn having the first high voltage Vh1 for pulling down the control signal SCn to the low power voltage Vss. During an interval T2, the gate signal SGn−2 is falling down from high voltage level to low voltage level, the second transistor 241 is then turned off and the driving control voltage VQn becomes a floating voltage. Concurrently, along with the switching of the first clock CK1 to high voltage level, the driving control voltage VQn is further boosted from the first high voltage Vh1 to a second high voltage Vh2 due to a capacitive coupling effect caused by the device capacitor of the first transistor 221. Accordingly, the first transistor 221 is turned on for pulling up the gate signal SGn from low voltage level to high voltage level; meanwhile, the fifth transistor 262 is still turned on by the driving control voltage VQn having the second high voltage Vh2 so as to continue pulling down the control signal SCn to the low power voltage Vss.

During an interval T3, the second clock CK2 is switching to high voltage level so that the seventh transistor 281 is turned on for pulling down the gate signal SGn to the low power voltage Vss. Besides, by making use of the gate signal SGn as a start pulse signal, the (N+2)th shift register stage (not shown) is enabled to generate the gate signal SGn+2 having high voltage level during the interval T3, and therefore the fourth transistor 256 is also turned on for pulling down the driving control voltage VQn from the second high voltage Vh2 to the low power voltage Vss. Furthermore, since the first clock CK1 is switching to low voltage level, the control signal SCn can be pulled down for retaining low voltage level via the second capacitor 261.

During an interval T4, the second clock CK2 is switching to low voltage level and turns off the seventh transistor 281. In the meantime, the first clock CK1 is switching to high voltage level, and therefore the control signal SCn is pulled up to high voltage level via the second capacitor 261. Accordingly, the sixth transistor 276, the eighth transistor 286 and the ninth transistor 287 are turned on by the control signal SCn having high voltage level for respectively pulling down the gate signal SGn, the gate signal SGn−1 and the gate signal SGn+1 to the low power voltage Vss. During an interval T5, the first clock CK1 is switching to low voltage level and pulls down the control signal SCn to low voltage level for turning off the sixth transistor 276, the eighth transistor 286 and the ninth transistor 287. Concurrently, the second clock CK2 is switching to high voltage level and turns on the seventh transistor 281 for pulling down the gate signal SGn to the low power voltage Vss.

Thereafter, as long as the gate signal SGn continues holding low voltage level, the aforementioned circuit operations of the Nth shift register stage 212, during the intervals T4 and T5, are repeated periodically so that the driving control voltage VQn and the gate signal SGn can be maintained at low voltage level. That is, the sixth transistor 276 and the eighth transistor 281 are employed to alternatively pull down the gate signal SGn to the low power voltage Vss; in addition, the eighth transistor 286 and the ninth transistor 287 are used to periodically assist in pulling down the gate signal SGn−1 and the gate signal SGn+1 to the low power voltage Vss. Also, the pull-down modules 292, 294 of the (N−1)th shift register stage 211 and the (N+1)th shift register stage 213 are employed to periodically assist in pulling down the gate signal SGn to the low power voltage Vss. For that reason, based on the aforementioned circuit operation having alternating and auxiliary pull-down mechanisms, each pull-down module of the gate driving circuit 200 is able to efficiently pull down corresponding gate signals with transistors having reduced channel widths. Therefore, the threshold voltage drifts regarding the transistors used in each pull-down module of the gate driving circuit 200 can be lessened significantly for enhancing the reliability and lifetime thereof.

Figure 4:
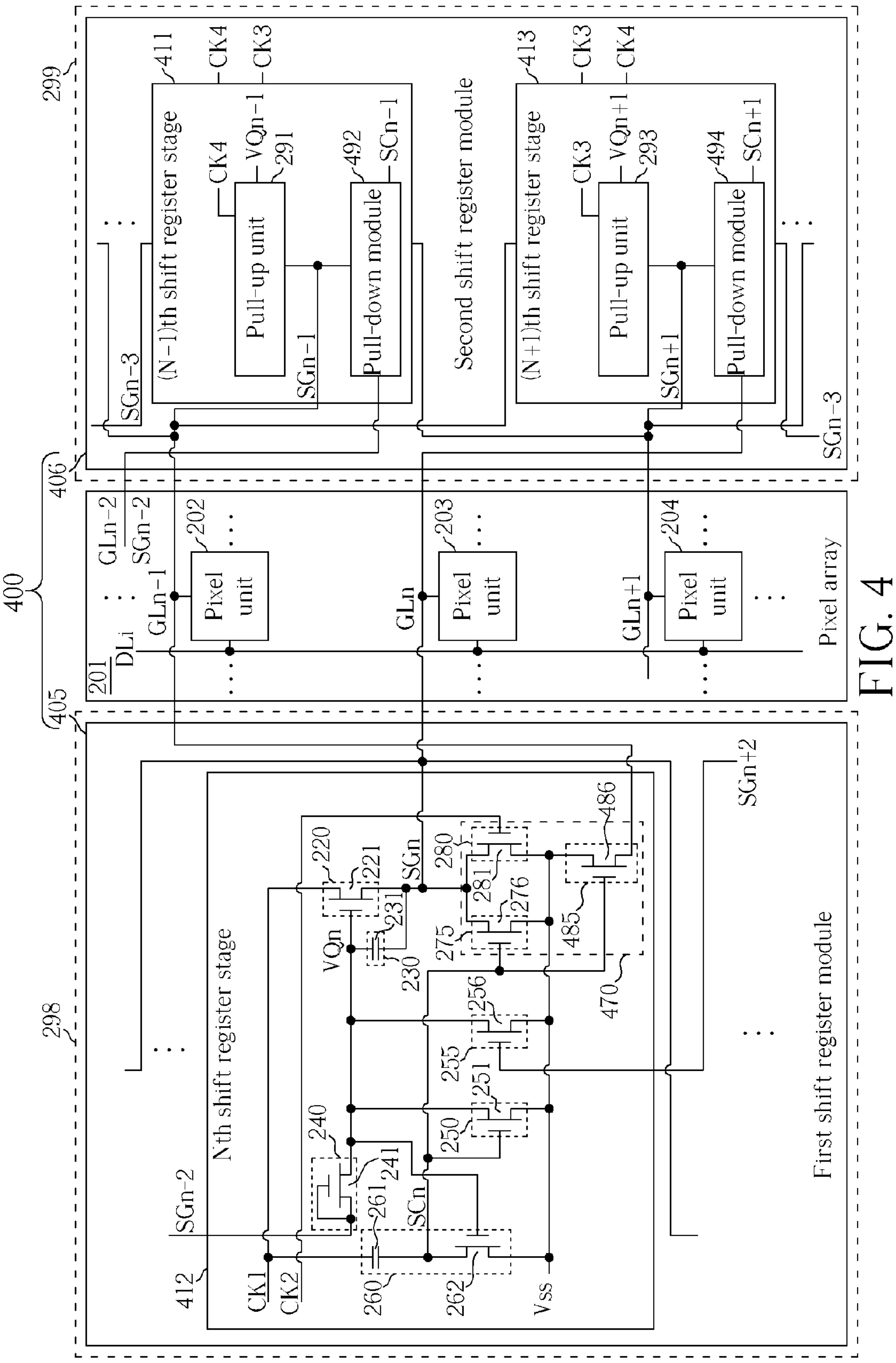
FIG. 4 is a schematic diagram showing a gate driving circuit in accordance with a second embodiment of the present invention.

FIG. 4 is a schematic diagram showing a gate driving circuit in accordance with a second embodiment of the present invention. As shown in FIG. 4, the gate driving circuit 400 comprises a first shift register module 405 and a second shift register module 406. The first shift register module 405 is disposed in the first border area 298 and the second shift register module 406 is disposed in the second border area 299. The first shift register module 405 includes a plurality of odd shift register stages and the second shift register module 406 includes a plurality of even shift register stages. For ease of explanation, the first shift register module 405 illustrates only an Nth shift register stage 412; the second shift register module 406 illustrates only an (N−1)th shift register stage 411 and an (N+1)th shift register stage 413; and only the internal structure of the Nth shift register stage 412 is exemplified in detail. The number N is a positive odd integer.

The structure and coupling relationship of the Nth shift register stage 412 is similar to that of the Nth shift register stage 212 shown in FIG. 2, differing in that the pull-down module 270 is replaced with a pull-down module 470. The auxiliary pull-down unit 485 of the pull-down module 470 only includes an eighth transistor 486. The coupling relationship of the eighth transistor 486 is identical to that of the eighth transistor 286 in the auxiliary pull-down unit 285 of the pull-down module 270. That is, the eighth transistor 486 is also employed to periodically assist in pulling down the gate signal SGn−1 to the low power voltage Vss. However, the auxiliary pull-down unit 485 cannot be employed to assist in pulling down the gate signal SGn+1.

Similarly, the pull-down modules 492, 494 of the (N−1)th shift register stage 411 and the (N+1)th shift register stage 413 can be employed to respectively assist in pulling down the gate signals SGn−2, SGn to the low power voltage Vss. The other circuit operation of the Nth shift register stage 412 is substantially identical to that of the Nth shift register stage 212 as aforementioned In view of that, based on the circuit operation having alternating and auxiliary pull-down mechanisms in the second embodiment, each pull-down module of the gate driving circuit 400 is also able to efficiently pull down corresponding gate signals with the aid of transistors having reduced channel widths. Therefore, the threshold voltage drifts regarding the transistors used in each pull-down module of the gate driving circuit 400 can still be lessened significantly for enhancing the reliability and lifetime thereof.

Figure 5:
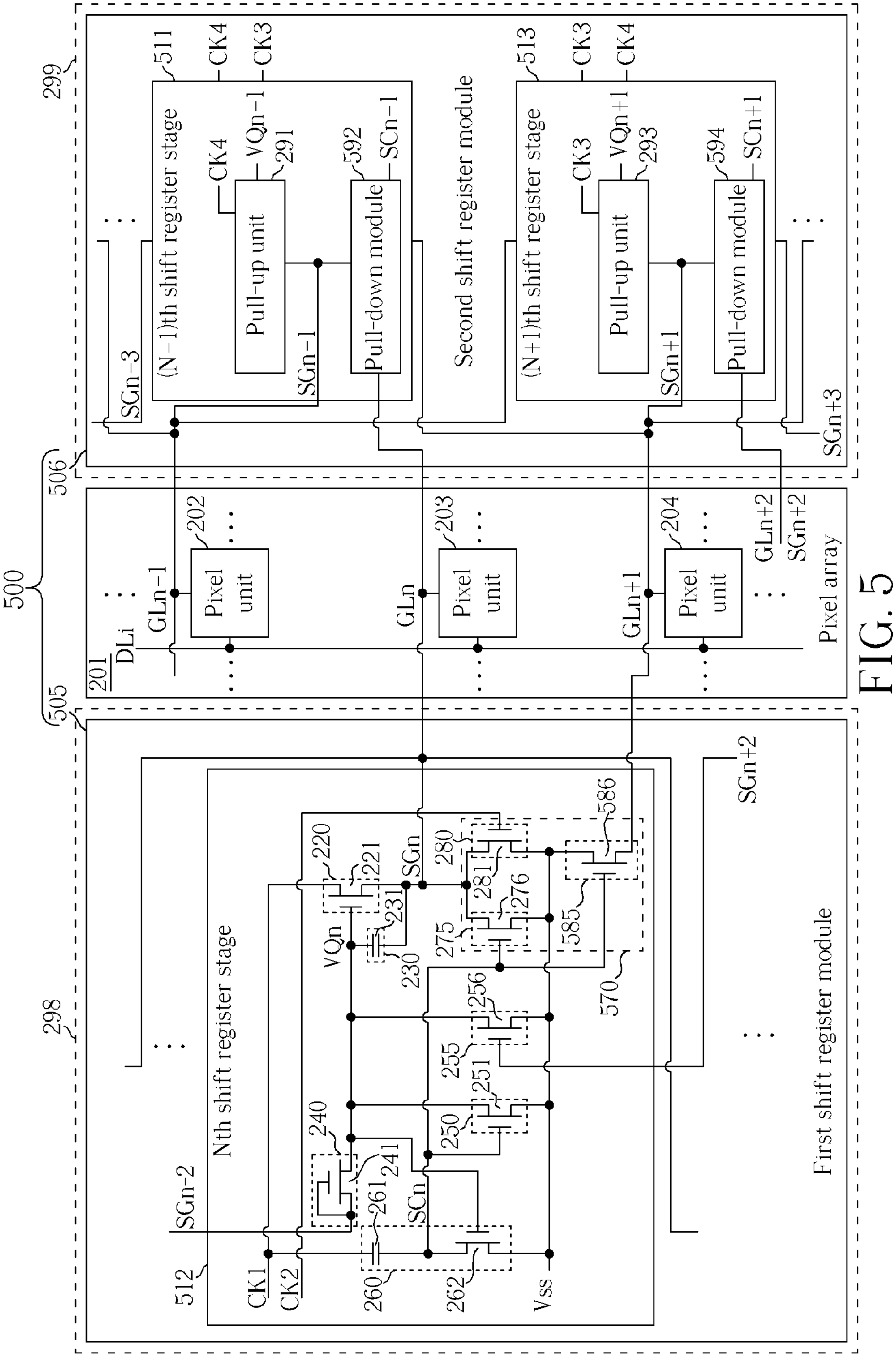
FIG. 5 is a schematic diagram showing a gate driving circuit in accordance with a third embodiment of the present invention.

FIG. 5 is a schematic diagram showing a gate driving circuit in accordance with a third embodiment of the present invention. As shown in FIG. 5, the gate driving circuit 500 comprises a first shift register module 505 and a second shift register module 506. The first shift register module 505 is disposed in the first border area 298 and the second shift register module 506 is disposed in the second border area 299. The first shift register module 505 includes a plurality of odd shift register stages and the second shift register module 506 includes a plurality of even shift register stages. For ease of explanation, the first shift register module 505 illustrates only an Nth shift register stage 512; the second shift register module 506 illustrates only an (N−1)th shift register stage 511 and an (N+1)th shift register stage 513; and only the internal structure of the Nth shift register stage 512 is exemplified in detail. The number N is a positive odd integer.

The structure and coupling relationship of the Nth shift register stage 512 is similar to that of the Nth shift register stage 212 shown in FIG. 2, differing in that the pull-down module 270 is replaced with a pull-down module 570. The auxiliary pull-down unit 585 of the pull-down module 570 only includes an eighth transistor 586. The coupling relationship of the eighth transistor 586 is identical to that of the ninth transistor 287 in the auxiliary pull-down unit 285 of the pull-down module 270. That is, the eighth transistor 586 is also employed to periodically assist in pulling down the gate signal SGn+1 to the low power voltage Vss. However, the auxiliary pull-down unit 585 cannot be employed to assist in pulling down the gate signal SGn−1.

Similarly, the pull-down modules 592, 594 of the (N−1)th shift register stage 511 and the (N+1)th shift register stage 513 can be employed to respectively assist in pulling down the gate signals SGn, SGn+2 to the low power voltage Vss. The other circuit operation of the Nth shift register stage 512 is substantially identical to that of the Nth shift register stage 212 as aforementioned In view of that, based on the circuit operation having alternating and auxiliary pull-down mechanisms in the third embodiment, each pull-down module of the gate driving circuit 500 is also able to efficiently pull down corresponding gate signals with the aid of transistors having reduced channel widths. Therefore, the threshold voltage drifts regarding the transistors used in each pull-down module of the gate driving circuit 500 can still be lessened significantly for enhancing the reliability and lifetime thereof.

Figure 6:
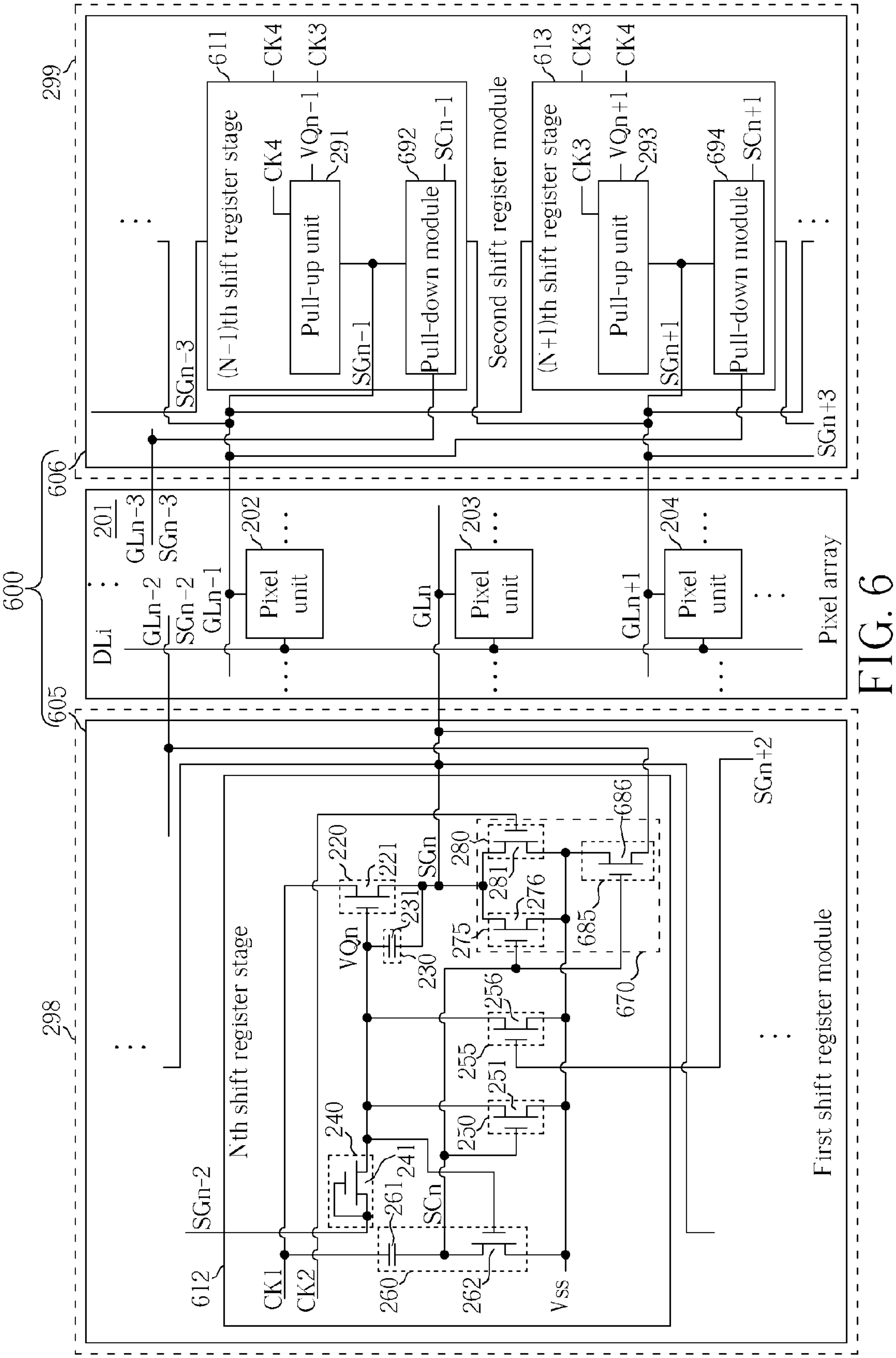
FIG. 6 is a schematic diagram showing a gate driving circuit in accordance with a fourth embodiment of the present invention.

FIG. 6 is a schematic diagram showing a gate driving circuit in accordance with a fourth embodiment of the present invention. As shown in FIG. 6, the gate driving circuit 600 comprises a first shift register module 605 and a second shift register module 606. The first shift register module 605 is disposed in the first border area 298 and the second shift register module 606 is disposed in the second border area 299. The first shift register module 605 includes a plurality of odd shift register stages and the second shift register module 606 includes a plurality of even shift register stages For ease of explanation, the first shift register module 605 illustrates only an Nth shift register stage 612; the second shift register module 606 illustrates only an (N−1)th shift register stage 611 and an (N+1)th shift register stage 613; and only the internal structure of the Nth shift register stage 612 is exemplified in detail. The number N is a positive odd integer.

The structure and coupling relationship of the Nth shift register stage 612 is similar to that of the Nth shift register stage 212 shown in FIG. 2, differing in that the pull-down module 270 is replaced with a pull-down module 670. The auxiliary pull-down unit 685 of the pull-down module 670 only includes an eighth transistor 686. The eighth transistor 686 comprises a first end electrically connected to the gate line GLn−2, a second end for receiving the low power voltage Vss, and a gate end electrically connected to the first end of the fifth transistor 262 for receiving the control signal SCn. Accordingly, the eighth transistor 686 is employed to periodically assist in pulling down the gate signal SGn−2 to the low power voltage Vss. However, the auxiliary pull-down unit 685 cannot be employed to assist in pulling down the gate signals SGn−1 and SGn+1.

Similarly, the pull-down modules 692, 694 of the (N−1)th shift register stage 611 and the (N+1)th shift register stage 613 can be employed to respectively assist in pulling down the gate signals SGn−3 and SGn−1. The other circuit operation of the Nth shift register stage 612 is substantially identical to that of the Nth shift register stage 212 as aforementioned. In view of that, based on the circuit operation having alternating and auxiliary pull-down mechanisms in the fourth embodiment, each pull-down module of the gate driving circuit 600 is also able to efficiently pull down corresponding gate signals with the aid of transistors having reduced channel widths. Therefore, the threshold voltage drifts regarding the transistors used in each pull-down module of the gate driving circuit 600 can still be lessened significantly for enhancing the reliability and lifetime thereof.

Figure 7:
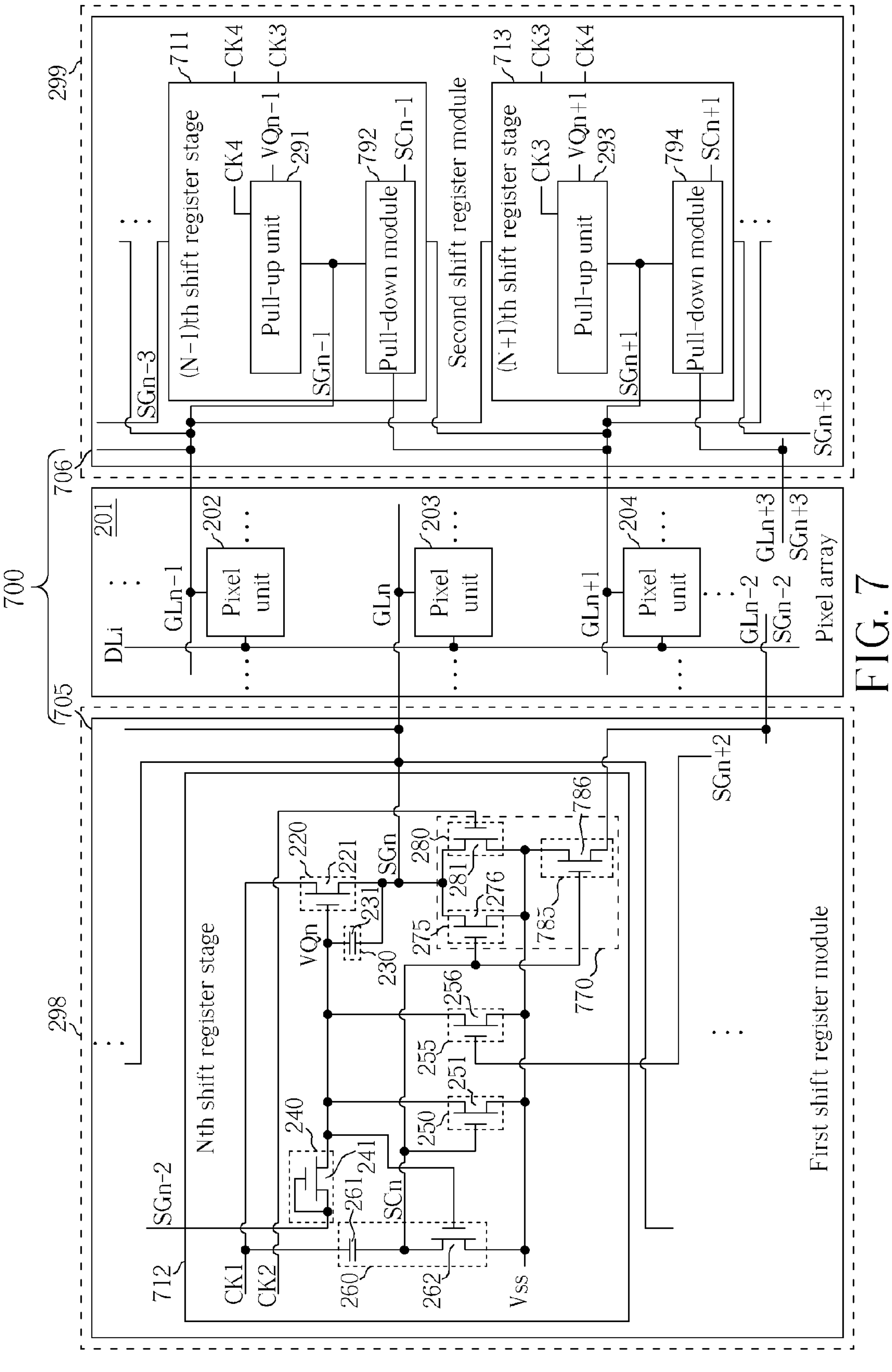
FIG. 7 is a schematic diagram showing a gate driving circuit in accordance with a fifth embodiment of the present invention.

FIG. 7 is a schematic diagram showing a gate driving circuit in accordance with a fifth embodiment of the present invention. As shown in FIG. 7, the gate driving circuit 700 comprises a first shift register module 705 and a second shift register module 706. The first shift register module 705 is disposed in the first border area 298 and the second shift register module 706 is disposed in the second border area 299. The first shift register module 705 includes a plurality of odd shift register stages and the second shift register module 706 includes a plurality of even shift register stages. For ease of explanation, the first shift register module 705 illustrates only an Nth shift register stage 712; the second shift register module 706 illustrates only an (N−1)th shift register stage 711 and an (N+1)th shift register stage 713; and only the internal structure of the Nth shift register stage 712 is exemplified in detail. The number N is a positive odd integer.

The structure and coupling relationship of the Nth shift register stage 712 is similar to that of the Nth shift register stage 212 shown in FIG. 2, differing in that the pull-down module 270 is replaced with a pull-down module 770. The auxiliary pull-down unit 785 of the pull-down module 770 only includes an eighth transistor 786. The eighth transistor 786 comprises a first end electrically connected to the gate line GLn+2, a second end for receiving the low power voltage Vss, and a gate end electrically connected to the first end of the fifth transistor 262 for receiving the control signal SCn. Accordingly, the eighth transistor 786 is employed to periodically assist in pulling down the gate signal SGn+2 to the low power voltage Vss. However, the auxiliary pull-down unit 785 cannot be employed to assist in pulling down the gate signals SGn−1 and SGn+1.

Similarly, the pull-down modules 792, 794 of the (N−1)th shift register stage 711 and the (N+1)th shift register stage 713 can be employed to respectively assist in pulling down the gate signals SGn+1 and SGn+3. The other circuit operation of the Nth shift register stage 712 is substantially identical to that of the Nth shift register stage 212 as aforementioned. In view of that, based on the circuit operation having alternating and auxiliary pull-down mechanisms in the fifth embodiment, each pull-down module of the gate driving circuit 700 is also able to efficiently pull down corresponding gate signals with the aid of transistors having reduced channel widths. Therefore, the threshold voltage drifts regarding the transistors used in each pull-down module of the gate driving circuit 700 can still be lessened significantly for enhancing the reliability and lifetime thereof.

Figure 8:
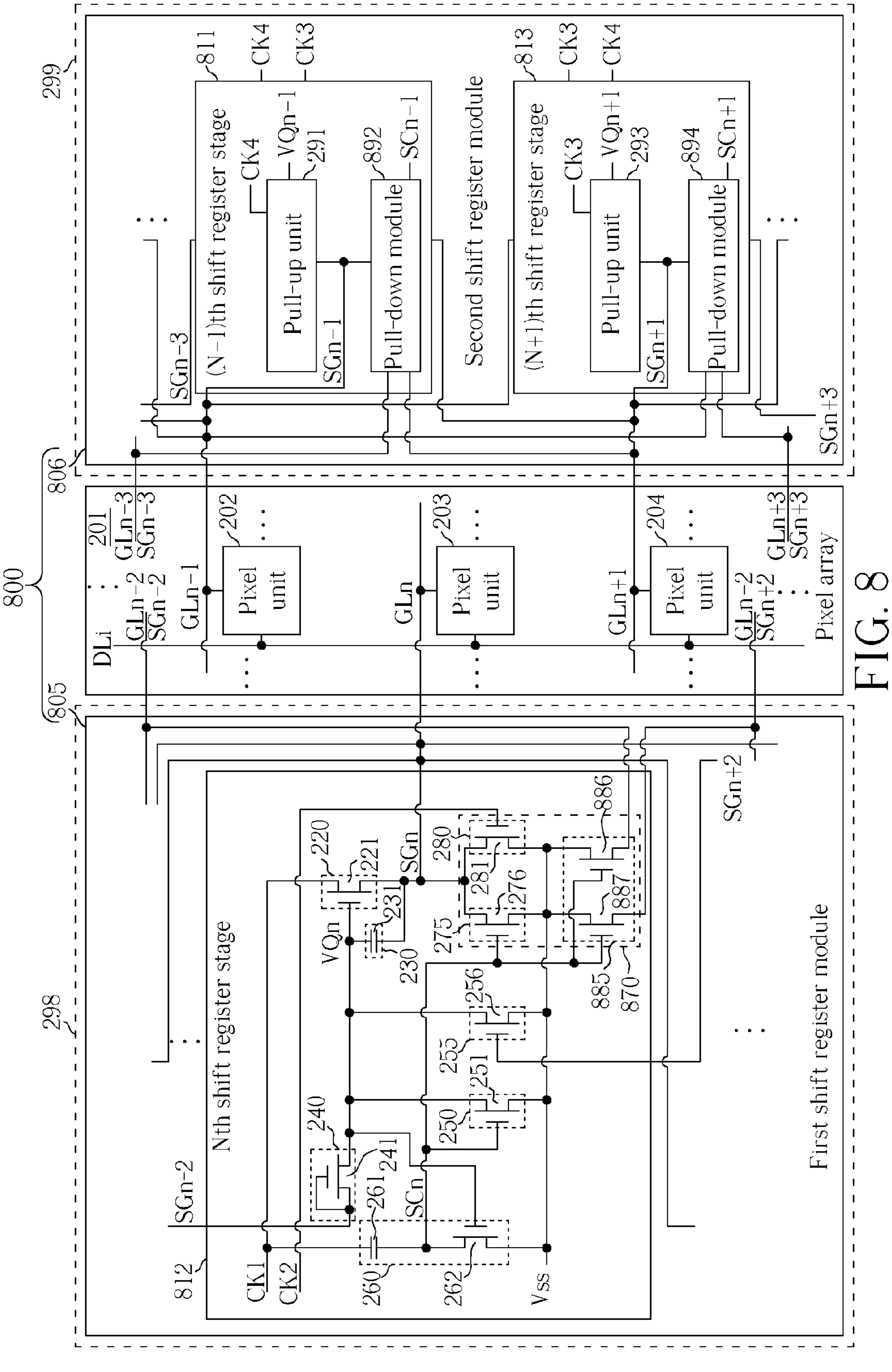
FIG. 8 is a schematic diagram showing a gate driving circuit in accordance with a sixth embodiment of the present invention.

FIG. 8 is a schematic diagram showing a gate driving circuit in accordance with a sixth embodiment of the present invention As shown in FIG. 8, the gate driving circuit 800 comprises a first shift register module 805 and a second shift register module 806. The first shift register module 805 is disposed in the first border area 298 and the second shift register module 806 is disposed in the second border area 299. The first shift register module 805 includes a plurality of odd shift register stages and the second shift register module 806 includes a plurality of even shift register stages. For ease of explanation, the first shift register module 805 illustrates only an Nth shift register stage 812; the second shift register module 806 illustrates only an (N−1)th shift register stage 811 and an (N+1)th shift register stage 813; and only the internal structure of the Nth shift register stage 812 is exemplified in detail. The number N is a positive odd integer.

The structure and coupling relationship of the Nth shift register stage 812 is similar to that of the Nth shift register stage 212 shown in FIG. 2, differing in that the pull-down module 270 is replaced with a pull-down module 870. The auxiliary pull-down unit 885 of the pull-down module 870 includes an eighth transistor 886 and a ninth transistor 887. The eighth transistor 886 comprises a first end electrically connected to the gate line GLn−2, a second end for receiving the low power voltage Vss, and a gate end electrically connected to the first end of the fifth transistor 262 for receiving the control signal SCn. The ninth transistor 887 comprises a first end electrically connected to the gate line GLn+2, a second end for receiving the low power voltage Vss, and a gate end electrically connected to the first end of the fifth transistor 262 for receiving the control signal SCn. Accordingly, the eighth transistor 886 is employed to periodically assist in pulling down the gate signal SGn−2 to the low power voltage Vss, and the ninth transistor 887 is employed to periodically assist in pulling down the gate signal SGn+2 to the low power voltage Vss. However, the auxiliary pull-down unit 885 cannot be employed to assist in pulling down the gate signals SGn−1 and SGn+1.

Similarly, the pull-down module 892 of the (N−1)th shift register stage 811 can be employed to assist in pulling down the gate signals SGn−3 and SGn+1, and the pull-down module 894 of the (N+1)th shift register stage 813 can be employed to assist in pulling down the gate signals SGn−1 and SGn+3. The other circuit operation of the Nth shift register stage 812 is substantially identical to that of the Nth shift register stage 212 as aforementioned. In view of that, based on the circuit operation having alternating and auxiliary pull-down mechanisms in the sixth embodiment, each pull-down module of the gate driving circuit 800 is also able to efficiently pull down corresponding gate signals with the aid of transistors having reduced channel widths. Therefore, the threshold voltage drifts regarding the transistors used in each pull-down module of the gate driving circuit 800 can still be lessened significantly for enhancing the reliability and lifetime thereof.

Figure 9:
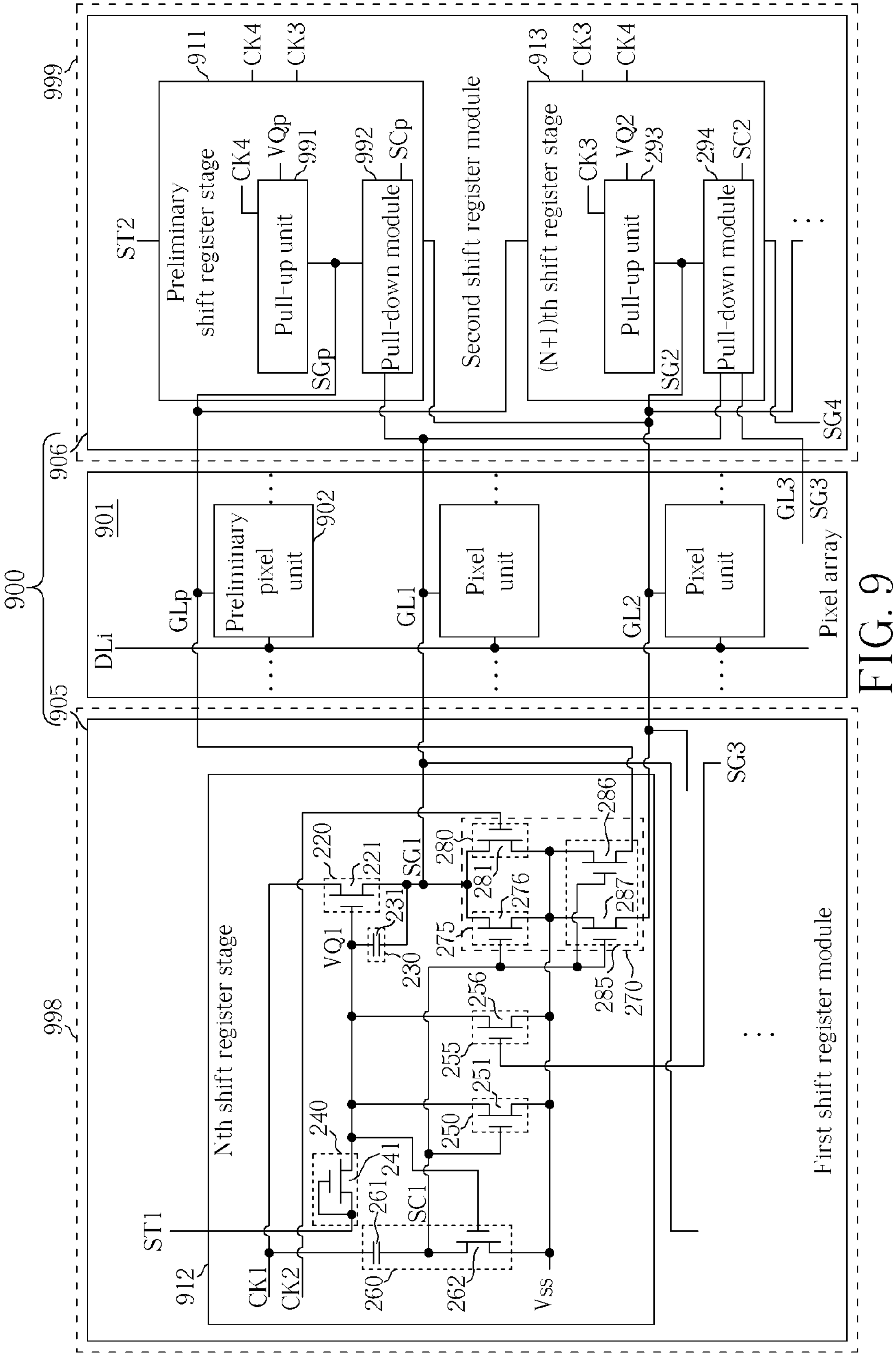
FIG. 9 is a schematic diagram showing a gate driving circuit in accordance with a seventh embodiment of the present invention.

FIG. 9 is a schematic diagram showing a gate driving circuit in accordance with a seventh embodiment of the present invention. As shown in FIG. 9, the gate driving circuit 900 comprises a first shift register module 905 and a second shift register module 906. The first shift register module 905 is disposed in a first border area 998 adjacent to a pixel array 901. The second shift register module 906 is disposed in a second border area 999 adjacent to the pixel array 901. The first border area 998 and the second border area 999 are substantially surrounding the pixel array 901 and positioned opposite to each other. The first shift register module 905 includes a plurality of odd shift register stages and the second shift register module 906 includes a plurality of even shift register stages and a preliminary shift register stage 911. For ease of explanation, the first shift register module 905 illustrates only a first shift register stage 912; the second shift register module 906 illustrates only the preliminary shift register stage 911 and a second shift register stage 913; and only the internal structure of the first shift register stage 912 is exemplified in detail.

The structure and coupling relationship of the first shift register stage 912 is similar to that of the Nth shift register stage 212 shown in FIG. 2, differing in that the input unit 240 is employed to receive a first start pulse signal ST1; furthermore, the first end of the eighth transistor 286 is electrically connected to a preliminary gate line GLp so as to assist in pulling down a preliminary gate signal SGp. The structure and coupling relationship of the second shift register stage 913 is similar to that of the (N+1)th shift register stage 213 shown in FIG. 2, differing in that the second shift register stage 913 is activated by the preliminary gate signal SGp functioning as a start pulse signal. If the preliminary shift register stage 911 is defined as a zeroth shift register stage, the structure and coupling relationship of the second shift register stage 913 is then identical to that of the (N+1)th shift register stage 213.

The preliminary shift register stage 911 functions to generate the preliminary gate signal SGp according to a second start pulse signal ST2, the third clock CK3 and the fourth clock CK4. The preliminary gate signal SGp is furnished to a preliminary pixel unit 902 via the preliminary gate line GLp. The preliminary shift register stage 911 is further used to assist in pulling down the gate signal SG1 of a gate line GL1. The preliminary shift register stage 911 includes a pull-up unit 991 and a pull-down module 992. The pull-up unit 991, electrically connected to the preliminary gate line GLp, is utilized for pulling up the preliminary gate signal SGp according to a preliminary driving control voltage VQp and the fourth clock CK4. The pull-down module 992 is employed to pull down the preliminary gate signal SGp and the gate signal SG1 according to a preliminary control signal SCp. With this structure in mind, it is noted that each odd or even shift register stage is employed to assist in pulling down the corresponding gate signals generated by a preceding shift register stage and a subsequent shift register stage. For instance, the pull-down module 270 of the first shift register stage 912 is used to assist in pulling down the preliminary gate signal SGp and the gate signal SG2 outputted respectively from the preliminary shift register stage 911, i.e. a preceding shift register stage, and the second shift register stage 913. However, the pull-down module 992 of the preliminary shift register stage 911 is used to assist in pulling down only the gate signal SG1 outputted from the first shift register stage 912, i.e. a subsequent shift register stage.

Regarding the aforementioned second through sixth embodiments shown in FIGS. 4-8, the first shift register module or the second shift register module can be disposed with a corresponding preliminary shift register stage so as to assist in pulling down the gate signal outputted from the first or second shift register stage. On the other hand, the preliminary shift register stage disposed can be used to provide a preliminary gate signal to a preliminary gate line so that the first or second shift register stage is able to perform an auxiliary pull-down operation.

In conclusion, the architecture of the gate driving circuit according to the present invention includes both alternating and auxiliary pull-down mechanisms. Accordingly, the pull-down module of each shift register stage is used to alternatively pull down the generated gate signal, and also functions to pull down at least one gate signal generated by the other shift register stage. Consequently, based on the circuit operation having alternating and auxiliary pull-down mechanisms in the gate driving circuit of the present invention, transistors having reduced channel widths can be put in use for efficiently pulling down gate signals so that the threshold voltage drifts of the transistors can be lessened significantly for enhancing the reliability and lifetime of the gate driving circuit.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A gate driving circuit for providing a plurality of gate signals to drive a pixel array having a plurality of gate lines, the gate driving circuit comprising:

a first shift register module comprising a plurality of odd shift register stages, each of the odd shift register stages providing a corresponding odd gate line of the gate lines with a corresponding gate signal of the gate signals according to a first clock and a second clock having a phase opposite to the first clock, the odd shift register stage being further employed to pull down at least one gate signal delivered by at least one even gate line of the gate lines or at least one odd gate line different from the corresponding odd gate line; and a second shift register module comprising a plurality of even shift register stages, each of the even shift register stages providing a corresponding even gate line of the gate lines with a corresponding gate signal of the gate signals according to a third clock and a fourth clock having a phase opposite to the third clock, the even shift register stage being further employed to pull down at least one gate signal delivered by at least one odd gate line of the gate lines or at least one even gate line different from the corresponding even gate line;

wherein an Nth shift register stage of the odd shift register stages comprises:

a pull-up unit, electrically connected to an Nth gate line of the gate lines, for pulling up an Nth gate signal of the gate signals to a high level voltage according to a driving control voltage and the first clock, wherein the Nth gate line is employed to deliver the Nth gate signal;

an input unit for receiving an (N−2)th gate signal generated by an (N−2)th shift register stage of the odd shift register stages;

an energy-store unit, electrically connected to the pull-up unit and the input unit, for providing the driving control voltage to the pull-up unit through performing a charging process based on the (N−2)th gate signal;

a first discharging unit, electrically connected to the energy-store unit, for pulling down the driving control voltage to a low power voltage according to a control signal, the first discharging unit comprising a transistor, the transistor comprising:

a first end electrically connected to the energy-store unit;

a gate end for receiving the control signal; and a second end for receiving the low power voltage;

a second discharging unit, electrically connected to the energy-store unit, for pulling down the driving control voltage to the low power voltage according to an (N+2)th gate signal generated by an (N+2)th shift register stage of the odd shift register stages;

a pull-down module for pulling down the Nth gate signal to the low power voltage according to the control signal and the second clock, the pull-down module being further employed to pull down the at least one gate signal delivered by the at least one even gate line or the at least one odd gate line different from the Nth gate line; and a control unit, electrically connected to the energy-store unit, the gate end of the first discharging unit and the pull-down module, for generating the control signal according to the driving control voltage and the first clock;

wherein N is a positive odd integer.

2. The gate driving circuit of claim 1, wherein the energy-store unit comprises a capacitor and the pull-up unit comprises a transistor, the transistor comprising:

a first end for receiving the first clock;

a gate end electrically connected to the capacitor for receiving the driving control voltage; and a second end electrically connected to the Nth gate line.

3. The gate driving circuit of claim 1, wherein the input unit comprises a transistor, the transistor comprising:

a first end electrically connected to the (N−2)th shift register stage for receiving the (N−2)th gate signal;

a gate end electrically connected to the first end; and a second end electrically connected to the energy-store unit.

4. The gate driving circuit of claim 1, wherein the second discharging unit comprises a transistor, the transistor comprising:

a first end electrically connected to the energy-store unit;

a gate end electrically connected to the (N+2)th shift register stage for receiving the (N+2)th gate signal; and a second end for receiving the low power voltage.

5. The gate driving circuit of claim 1, wherein the pull-down module comprises:

a first transistor comprising:

a first end electrically connected to the Nth gate line;

a gate end electrically connected to the control unit for receiving the control signal; and a second end for receiving the low power voltage; and a second transistor comprising:

a first end electrically connected to the Nth gate line;

a gate end for receiving the second clock; and a second end for receiving the low power voltage.

6. The gate driving circuit of claim 5, wherein the pull-down module further comprises a third transistor, the third transistor comprising:

a first end electrically connected to an (N−1)th gate line of the gate lines;

a gate end electrically connected to the control unit for receiving the control signal; and a second end for receiving the low power voltage.

7. The gate driving circuit of claim 5, wherein the pull-down module further comprises a third transistor, the third transistor comprising:

a first end electrically connected to an (N+1)th gate line of the gate lines;

a gate end electrically connected to the control unit for receiving the control signal; and a second end for receiving the low power voltage.

8. The gate driving circuit of claim 5, wherein the pull-down module further comprises a third transistor, the third transistor comprising:

a first end electrically connected to an (N−2)th gate line of the gate lines;

a gate end electrically connected to the control unit for receiving the control signal; and a second end for receiving the low power voltage.

9. The gate driving circuit of claim 5, wherein the pull-down module further comprises a third transistor, the third transistor comprising:

a first end electrically connected to an (N+2)th gate line of the gate lines;

a gate end electrically connected to the control unit for receiving the control signal; and a second end for receiving the low power voltage.

10. The gate driving circuit of claim 1, wherein the control unit comprises:

a transistor comprising:

a first end for outputting the control signal;

a gate end electrically connected to the energy-store unit for receiving the driving control voltage; and a second end for receiving the low power voltage; and a capacitor comprising:

a first end for receiving the first clock; and a second end electrically connected to the first end of the transistor.

11. The gate driving circuit of claim 1, wherein an (N+1)th shift register stage of the even shift register stages comprises:

a pull-up unit, electrically connected to an (N+1)th gate line of the gate lines, for pulling up an (N+1)th gate signal of the gate signals to a high level voltage according to a driving control voltage and the third clock, wherein the (N+1)th gate line is employed to deliver the (N+1)th gate signal;

an input unit for receiving an (N−1)th gate signal generated by an (N−1)th shift register stage of the even shift register stages;

an energy-store unit, electrically connected to the pull-up unit and the input unit, for providing the driving control voltage to the pull-up unit through performing a charging process based on the (N−1)th gate signal;

a first discharging unit, electrically connected to the energy-store unit, for pulling down the driving control voltage to a low power voltage according to a control signal;

a second discharging unit, electrically connected to the energy-store unit, for pulling down the driving control voltage to the low power voltage according to an (N+3)th gate signal generated by an (N+3)th shift register stage of the even shift register stages;

a pull-down module for pulling down the (N+1)th gate signal to the low power voltage according to the control signal and the fourth clock, the pull-down module being further employed to pull down the at least one gate signal delivered by the at least one odd gate line or the at least one even gate line different from the (N+1)th gate line; and a control unit, electrically connected to the energy-store unit, the first discharging unit and the pull-down module, for generating the control signal according to the driving control voltage and the third clock;

wherein N is a positive odd integer.

12. The gate driving circuit of claim 11, wherein the energy-store unit comprises a capacitor and the pull-up unit comprises a transistor, the transistor comprising:

a first end for receiving the third clock;

a gate end electrically connected to the capacitor for receiving the driving control voltage; and a second end electrically connected to the (N+1)th gate line.

13. The gate driving circuit of claim 11, wherein the input unit comprises a transistor, the transistor comprising:

a first end electrically connected to the (N−1)th shift register stage for receiving the (N−1)th gate signal;

a gate end electrically connected to the first end; and a second end electrically connected to the energy-store unit.

14. The gate driving circuit of claim 11, wherein the first discharging unit comprises a transistor, the transistor comprising:

a first end electrically connected to the energy-store unit;

a gate end electrically connected to the control unit for receiving the control signal; and a second end for receiving the low power voltage.

15. The gate driving circuit of claim 11, wherein the second discharging unit comprises a transistor, the transistor comprising:

a first end electrically connected to the energy-store unit;

a gate end electrically connected to the (N+3)th shift register stage for receiving the (N+3)th gate signal; and a second end for receiving the low power voltage.

16. The gate driving circuit of claim 11, wherein the pull-down module comprises:

a first transistor comprising:

a first end electrically connected to the (N+1)th gate line;

a gate end electrically connected to the control unit for receiving the control signal; and a second end for receiving the low power voltage; and a second transistor comprising:

a first end electrically connected to the (N+1)th gate line;

a gate end for receiving the fourth clock; and a second end for receiving the low power voltage.

17. The gate driving circuit of claim 16, wherein the pull-down module further comprises a third transistor, the third transistor comprising:

a first end electrically connected to an Nth gate line of the gate lines;

a gate end electrically connected to the control unit for receiving the control signal; and a second end for receiving the low power voltage.

18. The gate driving circuit of claim 16, wherein the pull-down module further comprises a third transistor, the third transistor comprising:

a first end electrically connected to an (N+2)th gate line of the gate lines;

a gate end electrically connected to the control unit for receiving the control signal; and a second end for receiving the low power voltage.

19. The gate driving circuit of claim 16, wherein the pull-down module further comprises a third transistor, the third transistor comprising:

a first end electrically connected to an (N−1)th gate line of the gate lines;

a gate end electrically connected to the control unit for receiving the control signal; and a second end for receiving the low power voltage.

20. The gate driving circuit of claim 16, wherein the pull-down module further comprises a third transistor, the third transistor comprising:

a first end electrically connected to an (N+3)th gate line of the gate lines;

a gate end electrically connected to the control unit for receiving the control signal; and a second end for receiving the low power voltage.

21. The gate driving circuit of claim 11, wherein the control unit comprises:

a transistor comprising:

a first end for outputting the control signal;

a gate end electrically connected to the energy-store unit for receiving the driving control voltage; and a second end for receiving the low power voltage; and a capacitor comprising:

a first end for receiving the third clock; and a second end electrically connected to the first end of the transistor.

22. The gate driving circuit of claim 1, wherein the first shift register module is disposed in a first border area adjacent to the pixel array and the second shift register module is disposed in a second border area adjacent to the pixel array, the first and second shift register modules being surrounding the pixel array and opposite to each other.

23. The gate driving circuit of claim 1, wherein the third clock has a phase shift of 90 degrees relative to the first clock.

24. The gate driving circuit of claim 1, wherein the second shift register module further comprises a preliminary shift register stage, the preliminary shift register stage being employed to pull down a corresponding gate signal delivered by a first or second gate line of the gate lines.

25. A gate driving circuit for providing a plurality of gate signals to drive a pixel array having a plurality of gate lines, the gate driving circuit comprising:

a first shift register module comprising a plurality of odd shift register stages, each of the odd shift register stages providing a corresponding odd gate line of the gate lines with a corresponding gate signal of the gate signals according to a first clock and a second clock having a phase opposite to the first clock, the odd shift register stage being further employed to pull down at least one gate signal delivered by at least one even gate line of the gate lines or at least one odd gate line different from the corresponding odd gate line; and a second shift register module comprising a plurality of even shift register stages, each of the even shift register stages providing a corresponding even gate line of the gate lines with a corresponding gate signal of the gate signals according to a third clock and a fourth clock having a phase opposite to the third clock, the even shift register stage being further employed to pull down at least one gate signal delivered by at least one odd gate line of the gate lines or at least one even gate line different from the corresponding even gate line;

wherein an (N+1)th shift register stage of the even shift register stages comprises:

a pull-up unit, electrically connected to an (N+1)th gate line of the gate lines, for pulling up an (N+1)th gate signal of the gate signals to a high level voltage according to a driving control voltage and the third clock, wherein the (N+1)th gate line is employed to deliver the (N+1)th gate signal;

an input unit for receiving an (N−1)th gate signal generated by an (N−1)th shift register stage of the even shift register stages;

an energy-store unit, electrically connected to the pull-up unit and the input unit, for providing the driving control voltage to the pull-up unit through performing a charging process based on the (N−1)th gate signal;

a first discharging unit, electrically connected to the energy-store unit, for pulling down the driving control voltage to a low power voltage according to a control signal, the first discharging unit comprising a transistor, the transistor comprising:

a first end electrically connected to the energy-store unit;

a gate end for receiving the control signal; and a second end for receiving the low power voltage;

a second discharging unit, electrically connected to the energy-store unit, for pulling down the driving control voltage to the low power voltage according to an (N+3)th gate signal generated by an (N+3)th shift register stage of the even shift register stages;

a pull-down module for pulling down the (N+1)th gate signal to the low power voltage according to the control signal and the fourth clock, the pull-down module being further employed to pull down the at least one gate signal delivered by the at least one odd gate line or the at least one even gate line different from the (N+1)th gate line; and a control unit, electrically connected to the energy-store unit, the gate end of the first discharging unit and the pull-down module, for generating the control signal according to the driving control voltage and the third clock;

wherein N is a positive odd integer.

26. A gate driving circuit for providing a plurality of gate signals to drive a pixel array having a plurality of gate lines, the gate driving circuit comprising:

a first shift register module comprising a plurality of odd shift register stages, each of the odd shift register stages providing a corresponding odd gate line of the gate lines with a corresponding gate signal of the gate signals according to a first clock and a second clock having a phase opposite to the first clock, the odd shift register stage being further employed to pull down at least one gate signal delivered by at least one even gate line of the gate lines or at least one odd gate line different from the corresponding odd gate line; and a second shift register module comprising a plurality of even shift register stages, each of the even shift register stages providing a corresponding even gate line of the gate lines with a corresponding gate signal of the gate signals according to a third clock and a fourth clock having a phase opposite to the third clock, the even shift register stage being further employed to pull down at least one gate signal delivered by at least one odd gate line of the gate lines or at least one even gate line different from the corresponding even gate line;

wherein the second shift register module further comprises a preliminary shift register stage, the preliminary shift register stage being employed to pull down a corresponding gate signal delivered by a first or second gate line of the gate lines.

* * * * *